United States Patent
Kubat et al.

(10) Patent No.: US 9,958,555 B2
(45) Date of Patent: May 1, 2018

(54) HIGH TRANSMITTANCE SINGLE CRYSTAL YAP SCINTILLATORS

(71) Applicants: Jan Kubat, Novy Bor (CZ); Jan Polak, Turnov (CZ); Martin Klejch, Liberec (CZ); Tomas Marek, Turnov (CZ)

(72) Inventors: Jan Kubat, Novy Bor (CZ); Jan Polak, Turnov (CZ); Martin Klejch, Liberec (CZ); Tomas Marek, Turnov (CZ)

(73) Assignee: CRYTUR, Turnov (CZ)

( * ) Notice: Subject to any disclaimer, the term of this patent is extended or adjusted under 35 U.S.C. 154(b) by 0 days. days.

(21) Appl. No.: 15/378,133

(22) Filed: Dec. 14, 2016

(65) Prior Publication Data

US 2017/0123081 A1 May 4, 2017

Related U.S. Application Data

(62) Division of application No. 14/217,712, filed on Mar. 18, 2014, now Pat. No. 9,541,669.

(51) Int. Cl.
*G01T 1/202* (2006.01)
*G01V 5/10* (2006.01)
(Continued)

(52) U.S. Cl.
CPC ........ *G01T 1/2023* (2013.01); *C01F 17/0025* (2013.01); *C09K 11/7706* (2013.01);
(Continued)

(58) Field of Classification Search
CPC ......... G01T 1/2023; G01T 1/20; G01V 5/101; G01V 5/04; G01V 5/104
See application file for complete search history.

(56) References Cited

U.S. PATENT DOCUMENTS

| 4,721,853 A | 1/1988 | Wraight |
| 4,937,446 A | 1/1990 | McKeon et al. |

(Continued)

FOREIGN PATENT DOCUMENTS

EP 2302107 3/2011

OTHER PUBLICATIONS

Cao et. al., "Effects of Growth Atmosphere and Annealing on Luminescence Efficiency of YAP:Ce Crystal", Journal of Alloys and Compounds, vol. 489, issue 2, Jan. 21, 2010, pp. 515-518 See Priority U.S. Appl. No. 14/217,712, filed Mar. 18, 2014.

(Continued)

*Primary Examiner* — Marcus Taningco
(74) *Attorney, Agent, or Firm* — Allen, Dyer, Doppelt + Gilchrist, P.A. Attorneys at Law

(57) ABSTRACT

A single crystal yttrium aluminum perovskite scintillator has a minimum thickness of at least 5 mm and a transmittance of at least 50% at a wavelength of 370 nm. A method for fabricating the yttrium aluminum perovskite scintillator includes acquiring a yttrium aluminum perovskite single crystal boule, annealing the yttrium aluminum perovskite single crystal boule in an oxygen containing environment to obtain a partially annealed crystal, and annealing the partially annealed crystal in an inert environment or a reducing environment to obtain the yttrium aluminum perovskite single crystal scintillator.

26 Claims, 3 Drawing Sheets

(51) Int. Cl.
*C30B 15/00* (2006.01)
*C30B 29/24* (2006.01)
*C30B 33/02* (2006.01)
*C01F 17/00* (2006.01)
*C09K 11/77* (2006.01)
*E21B 49/00* (2006.01)

(52) U.S. Cl.
CPC .......... *C09K 11/7774* (2013.01); *C30B 15/00* (2013.01); *C30B 29/24* (2013.01); *C30B 33/02* (2013.01); *E21B 49/00* (2013.01); *G01T 1/2026* (2013.01); *G01V 5/101* (2013.01); *C01P 2002/34* (2013.01)

(56) References Cited

U.S. PATENT DOCUMENTS

| | | | |
|---|---|---|---|
| 5,313,504 A | 5/1994 | Czirr | |
| 5,864,141 A | 1/1999 | Majewski et al. | |
| 8,399,849 B1* | 3/2013 | Krishnan | G01T 3/06 250/253 |
| 2003/0076914 A1 | 4/2003 | Tiller et al. | |
| 2004/0000645 A1* | 1/2004 | Ramsden | G01T 1/20 250/361 R |
| 2010/0223010 A1 | 9/2010 | Nikitin et al. | |
| 2011/0272141 A1 | 11/2011 | Lewis et al. | |
| 2012/0116732 A1 | 5/2012 | Barnes et al. | |
| 2013/0234032 A1 | 9/2013 | Wang et al. | |

OTHER PUBLICATIONS

Zeng et. al., "Effects of Annealing on the Color, Absorption Spectra, and Light Yield of Ce:YAlO3 Single Crystal Grown by the Temperature Gradient Technique", Journal of Applied Physics, vol. 95, No. 2, Jan. 15, 2004, pp. 749-751 See Priority U.S. Appl. No. 14/217,712, filed Mar. 18, 2014.

Baccaro et al., Refractive index and absorption length of YAP; Ce scintillation crystal and reflectance of the coating used in YAP: Ce single-crystal matrix, Elsevier, Nuclear Instruments & Methods in Physics Research, Jul. 1997, pp. 479-485 See Priority U.S. Appl. No. 14/217,712, filed Mar. 18, 2014.

Ovanesyan et al., Single crystal growth and characterization of LaLuO3, Elsevier, Optical Materials, Nov. 1997, pp. 291-295 See Priority U.S. Appl. No. 14/217,712, filed Mar. 18, 2014.

Sugak et al., Optical in situ study of reduction/oxidation processes in YAlO3, Elsevier, Science Direct, Jun. 2008, pp. 6310-6318 See Priority U.S. Appl. No. 14/217,712, filed Mar. 18, 2014.

Totsuka et al., Investigations of optical and scintillation properties of (Lu0.1Y0.9) AlO3; Nd01%, IEEE Transactions on Nuclear Science, vol. 59, No. 5, Oct. 2012, pp. 2156-2160 See Priority U.S. Appl. No. 14/217,712, filed Mar. 18, 2014.

* cited by examiner

HIGH TRANSMITTANCE SINGLE CRYSTAL YAP SCINTILLATORS

CROSS REFERENCE TO RELATED APPLICATIONS

This application is a divisional application of pending U.S. Patent Publication No. 2015/0268375, published on Sep. 24, 2015, which is hereby incorporated herein in its entirety by reference.

FIELD OF THE INVENTION

Disclosed embodiments relate generally to single crystal scintillators and more particularly to yttrium aluminum perovskite (YAP) single crystal scintillators and methods for fabricating the scintillator.

BACKGROUND INFORMATION

Scintillators are used widely in the detection and spectroscopy of energetic photons (e.g., x-rays and gamma rays). They are commonly used in nuclear and high energy physics research, medical imaging, and downhole logging operations (e.g., operations in which gamma ray measurements are used to determine properties of subterranean formations).

Single crystal Yttrium Aluminum Perovskite (e.g., $YAlO_3:Ce^{3+}$) is one promising scintillating material. However, such crystals are known to be characterized as having both a spatially non-uniform performance and a low transmittance due to the presence of color centers in the crystal. The color centers (F-centers and $F^+$-centers) are believed to cause self-absorption of light emitted by the $Ce^{3+}$ luminescence centers. The color centers may be concentrated in certain regions of the crystal (e.g., in the lower and internal portions of the crystal, for example as depicted on FIG. 1), depending on crystal growth conditions. Since light output efficiency is an important scintillator property, the presence of the color centers tends to limit the utility of Yttrium Aluminum Perovskite scintillators. Moreover, the presence of the color centers limits the size of the crystal scintillators that may be utilized. In an attempt to overcome this difficulty very thin crystals have been utilized in the prior art. For example, Zeng et al (*Effects of Annealing on the Color, Absorption Spectra, and Light Yield of Ce:YAlO₃ Single Crystal Grown by the Temperature Gradient Technique, Journal of Applied Physics* 95(2), 749, 2004) utilized crystals having a thickness of 1 mm and Cao et al (*Effects of Growth Atmosphere and Annealing on Luminescence Efficiency of YAP:Ce Crystal, Journal of Alloys and Compounds* 489, 515, 2010) utilized crystals having thicknesses of 0.36 and 2 mm. At thicknesses greater than about 5 mm annealing has not been previously shown to effectively remove color centers and other defects from the crystals.

Therefore a need remains in the art for improved Yttrium Aluminum Perovskite scintillators and methods for fabricating such scintillators.

SUMMARY

A single crystal yttrium aluminum perovskite scintillator having a minimum thickness of at least 5 mm and a transmittance of at least 50% at a wavelength of 370 nm is disclosed. A method for fabricating the yttrium aluminum perovskite scintillator is also disclosed. The method includes acquiring a yttrium aluminum perovskite single crystal boule, annealing the yttrium aluminum perovskite single crystal boule in an oxygen containing environment to obtain a partially annealed crystal, and annealing the partially annealed crystal in an inert environment or a reducing environment to obtain the yttrium aluminum perovskite single crystal scintillator.

The disclosed embodiments may provide various technical advantages. For example, the disclosed embodiments provide a bulk single crystal yttrium aluminum perovskite scintillator having a high transmittance and a method for fabricating such as scintillator. The disclosed embodiment may therefore significantly increase the efficiency of yttrium aluminum perovskite scintillators thereby enabling such scintillators to be used in a broader range of applications, for example, including medical imaging and downhole logging applications.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

For a more complete understanding of the disclosed subject matter, and advantages thereof, reference is now made to the following descriptions taken in conjunction with the accompanying drawings, in which.

DETAILED DESCRIPTION

Figure 1:
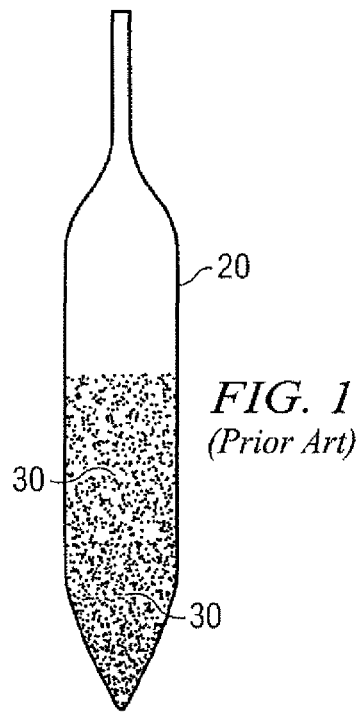
FIG. 1 depicts a prior art Yttrium Aluminum Perovskite (YAP) crystal.

FIG. 1 depicts a prior art Yttrium Aluminum Perovskite (YAP) single crystal 20. Such prior art crystals are known to include color centers 30 distributed throughout the crystal. The color centers are often non-uniformly distributed through the crystal with lower portions of the crystal including a higher concentration of color centers (the nature of the distribution is generally influenced by the crystal growth conditions). It will be understood that FIG. 1 is not intended to show that there are no color centers in the upper portion of the crystal, but rather that the color centers tend to be non-uniformly distributed with a higher concentration in the lower portion of the crystal. The color centers are believed to cause self-absorption of light emitted by the $Ce^{3+}$ luminescence centers and therefore lower the transmittance of the crystal. Since light output efficiency is an important scintillator property, the presence of the color centers tends to limit the utility of Yttrium Aluminum Perovskite scintillators. Moreover, as described above, the presence of the color centers limits the size of the crystal scintillators that may be utilized.

Figure 2:
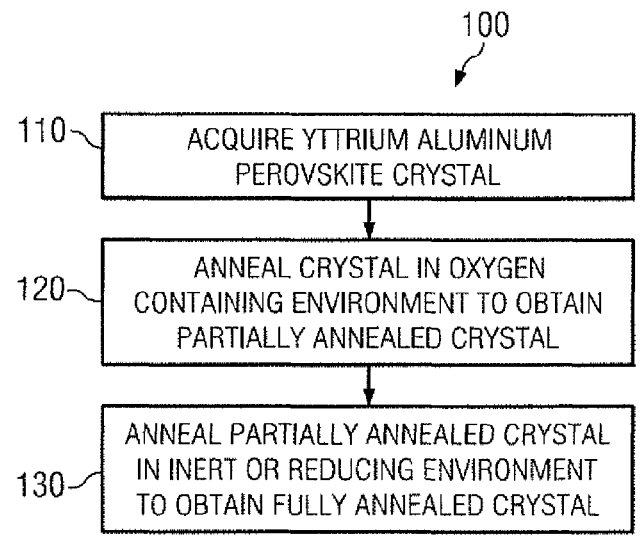
FIG. 2 depicts a flow chart of one example of a method for fabricating a Yttrium Aluminum Perovskite (YAP) crystal scintillator.

FIG. 2 depicts a flow chart of one example of a method 100 for fabricating a Yttrium Aluminum Perovskite (YAP) crystal scintillator. In the depicted embodiment, a yttrium aluminum perovskite single crystal boule is acquired at 110. The acquired crystal may then heat treated using a first annealing process in an oxygen containing environment at 120 to obtain a partially annealed crystal. The partially annealed crystal may then further heat treated in high vacuum or in a reducing or inert environment at 130 to obtain a fully annealed crystal scintillator.

Figure 3:
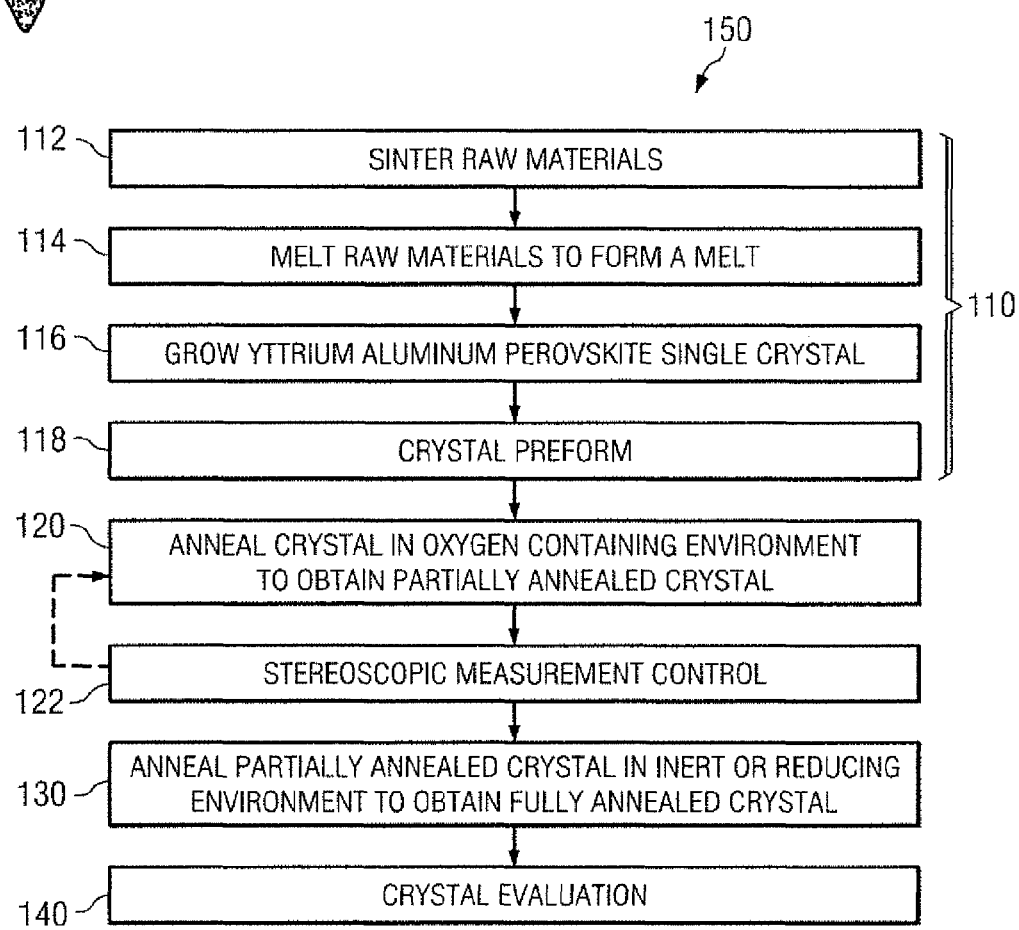
FIG. 3 depicts a flow chart of a more detailed embodiment of the method depicted on FIG. 2 for fabricating a Yttrium Aluminum Perovskite (YAP) crystal scintillator.

FIG. 3 depicts a flow chart of an optional, more detailed embodiment 150 of the method depicted on FIG. 2 for fabricating a YAP crystal scintillator. At 112 the yttrium and aluminum raw materials (e.g., the $Y_2O_3$ and $Al_2O_3$ oxides) may be sintered, for example to burn off (remove) residual impurities prior to melting at 114 to form the melt. The YAP crystal may be drawn or pulled from the melt at 116 as described in more detail below. The as grown crystal may then be cut or cleaved or otherwise shaped to obtain a crystal preform (a single crystal of the desired size and shape) at 118. The obtained crystal may then be heat treated using a first annealing process in an oxygen containing environment at 120 to obtain a partially annealed crystal. The first annealing process may include spectroscopic measurement control 122 to provide feedback regarding the length of the annealing step. The partially annealed crystal may then be further heat treated in high vacuum or in a reducing or inert environment at 130 to obtain a fully annealed crystal scintillator. The fully annealed crystal may be evaluated at 140, for example, via measuring a transmission spectrum as described in more detail below.

Figure 4:
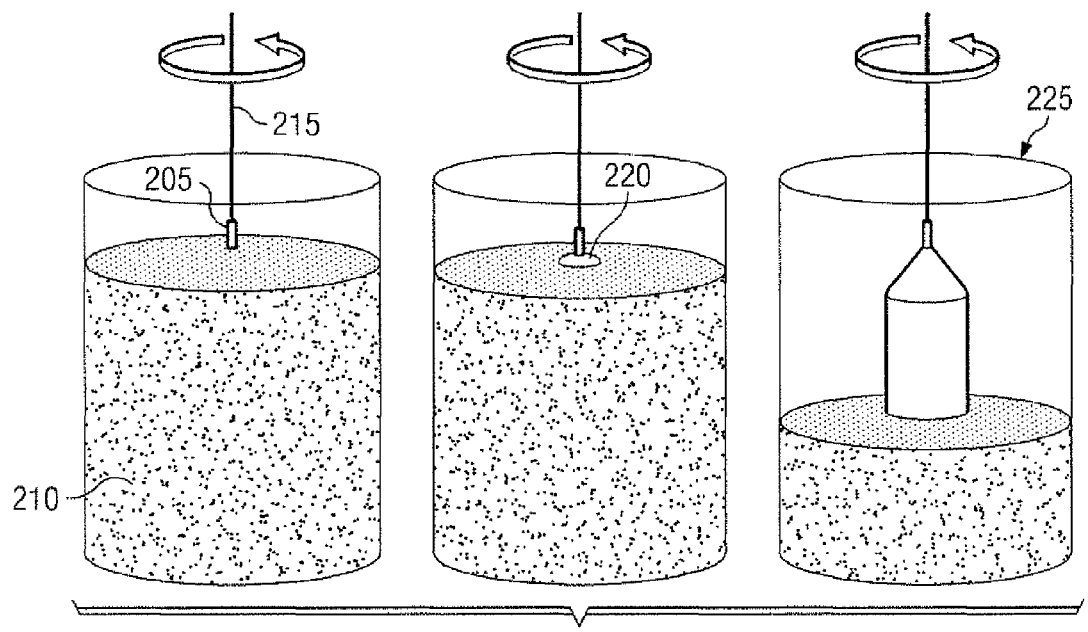
FIG. 4 schematically depicts one example of a suitable crystal growth method using the Czochralski method.

With continued reference to FIGS. 2 and 3, substantially any suitable crystal growth process may be utilized. For example, the crystal growth process may include the Czochralski method in which the crystal is drawn or pulled from the liquid melt. FIG. 4 schematically depicts one example of a suitable crystal growth process. In the Czochralski method a seed crystal 205 is introduced into the melt 210 on the end of a slowly rotating metal rod 215 thereby initiating crystal growth (e.g., as shown at 220). Crystal growth continues as the rod is drawn upwards out of the melt (in a process called crystal pulling) as shown at 225. This process is commonly used to grow large silicon crystals for use in the semiconductor industry. The YAP crystal grown by this process preferably has a <100>, <010>, or a <001> crystal orientation.

Other suitable crystal growth methods that may be employed at 110 may include, for example, the Bridgman method, the vertical gradient freeze (VGF) method, the horizontal gradient freeze (HGF) method, and the gradient solidification method (GSM). In the Bridgman method an ampoule is used in which the melt and the crystal are contained. The ampoule containing the initially solid growth material is vertically moved upwards in the furnace so that the material melts top-down. At the bottom of the ampoule a mono-crystalline seed crystal is contained. After this seed crystal has been partly melted, the ampoule is slowly pulled back so that the crystal grows from the bottom up starting at the seed crystal.

In the VGF method several concentric heating circuits which are superimposed upon each other are arranged around the stationary melting crucible in jacket form. Each of these heating circuits can be separately energized. By slowly decreasing the heat output of each single heating circuit arranged around the crucible wall the temperature can be slowly decreased below the crystallisation point, thus producing a radial temperature gradient along which the crystal growth takes place. The HGF method is similar to the VHF method with the exception that the construction is rotated by 90 degrees. The GSM is also similar to the HGF and VHF methods with the exception that the heating circuits are slowly moved during the crystallization process.

With reference again to FIGS. 2 and 3, the obtained crystal (e.g., obtained using the Czochralski method depicted on FIG. 4) is heat treated using a first annealing step to obtain a partially annealed crystal. In the first annealing step the crystal is annealed in an oxygen containing environment, for example, in air or other oxygen containing gases at substantially any suitable oxygen concentration. The time length of the first annealing step generally depends on the size of the crystal and the annealing temperature with the time generally increasing with increasing crystal size and decreasing temperature. The time length may be, for example, at least about 30 minutes (e.g., at least about 45 minutes or at least about 60 minutes). The time length may be, for example, about 6 hours or less (e.g., about 4 hours or less or about 3 hours or less). The time length may, for example, be in a range from about 30 minutes to about 6 hours (e.g., from about 45 minutes to about 4 hours or from about 1 hour to about 3 hours).

The annealing temperature of the first annealing step may be, for example at least about 1000 degrees C. (e.g., at least about 1050 degrees C. or at least about 1100 degrees C.). The annealing temperature of the first annealing step may be, for example, about 1500 degrees C. or less (e.g., about 1400 degrees C. or less or about 1300 degrees C. or less). The annealing temperature of the first annealing step may be in a range from about 1000 degrees C. to about 1500 degrees C. (e.g., from about 1050 degrees C. to about 1400 degrees C. or from about 1100 degrees C. to about 1300 degrees C.).

The first annealing step may further include a multi-step process, for example, including a two-step or a three-step process. For example, in a two-step process the crystal may be placed in a furnace at a first temperature (e.g., ambient temperature) and heated with the temperature of the furnace increasing over a period time to the annealing temperature. The crystal may remain in the furnace at the annealing temperature for a predetermined time before being removed. In an alternative two-step process the crystal may be placed in a furnace already pre-heated to the annealing temperature. After some predetermined time the furnace may then be cooled to a second temperature (e.g., ambient temperature) over a period of time. In a three-step process, the crystal may be placed in a furnace at a first temperature (e.g., ambient temperature) and heated over a first period time to the annealing temperature. After some predetermined time at the annealing temperature the furnace may then be cooled to a second temperature (e.g., ambient temperature) over a second period of time. In such two-step and three-step processes, the first and second periods of time may be of substantially any time length, for example in a range from about 1 to about 8 hours.

With continued reference to FIGS. 2 and 3, the partially annealed crystal is annealed in a second annealing step to obtain a fully annealed crystal scintillator. The partially annealed crystal may be annealed in the second annealing step in substantially any inert environment, reducing environment, or mixture thereof. An inert environment may include any of the noble gases, nitrogen, and mixtures thereof. For example, an inert environment may include purified argon or nitrogen gas. An inert environment may also include an evacuated environment, for example, at a pressure less than about $5 \times 10^{-4}$ mbar. A reducing environment may include any reducing gases such as hydrogen, carbon monoxide, methane, ammonia, hydrogen sulphide, and mixtures thereof. For example, a reducing environment may include purified hydrogen gas.

The time length of the second annealing step also generally depends on the size of the crystal and the annealing temperature with the time generally increasing with increasing crystal size and decreasing temperature. The time length may be, for example, at least about 20 hours (e.g., at least about 40 hours, at least about 80 hours, at least about 120 hours, or at least about 200 hours). The annealing temperature of the second annealing step may be, for example, at least about 1500 degrees C. (e.g., at least 1600 degrees C., or at least about 1700 degrees C.). The annealing temperature of the second annealing step may be, for example, about 2000 degrees C. or less (e.g., about 1900 degrees C. or less or about 1800 degrees C. or less). The annealing temperature of the second annealing step may be in a range from about 1500 degrees C. to about 2000 degrees C. (e.g., from about 1600 degrees C. to about 1900 degrees C. or from about 1700 degrees C. to about 1800 degrees C.). As with the first annealing step the second annealing step may include a two-step or a three-step process, for example, as described above.

Figure 5A:
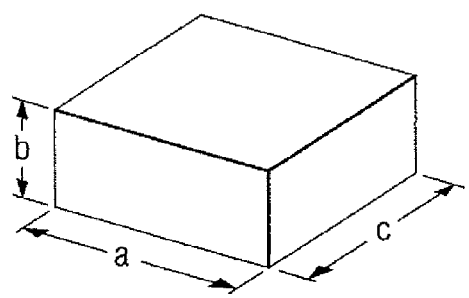
FIGS. 5A and 5B depict cuboidal (FIG. 5A) and cylindrical (FIG. 5B) YAP scintillator crystals obtained using the method depicted on FIG. 3.
Figure 5B:
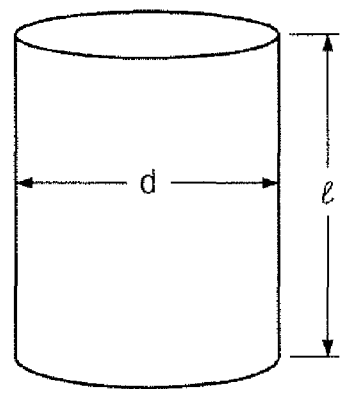

FIGS. 5A and 5B depict first and second example annealed YAP scintillator crystals obtained using the methods depicted on FIGS. 2 and/or 3. In the example depicted on FIG. 5A, crystal scintillator 300 has a cuboidal shape with dimensions a, b, and c. Embodiments of the crystal fabrication methodology disclosed herein advantageously may enable large dimension YAP crystal scintillators to be fabricated. For example, the crystal scintillator may have a thickness of at least 5 mm (e.g., at least 10 mm, at least 15 mm, or at least 20 mm). In the depicted embodiment, crystal scintillator 300 may have a, b, and c dimensions of at least 5 mm (e.g., at least 10 mm, at least 15 mm, or at least 20 mm). In the example depicted on FIG. 5B, crystal scintillator 400 has a cylindrical shape in which both the length l and the diameter d of the crystal are at least 5 mm (e.g., at least 10 mm, at least 15 mm, or at least 20 mm).

The disclosed YAP scintillator crystals may be further characterized as having a $Ce^{3+}$ concentration of at least 0.02 weight percent and a $Ce^{4+}$ concentration of less than 0.1 weight percent (and preferably less than 0.01 weight percent). The annealed crystals further preferably have a <100>, <010>, or a <001> crystal orientation.

The annealed YAP scintillator crystals may be further characterized as having a high optical transmittance at wavelengths in a range from about 340 to about 380 nm. Optical transmittance is a measure of the fraction of incident light at a specified wavelength or range of wavelengths that passes through a sample (i.e., that is not reflected or absorbed by the sample). The YAP scintillator crystals (grown and annealed as described above) have a transmittance of at least 50% at wavelengths in the range from about 340 to about 380 nm. The transmittance may further be at least 60%, at least 70%, or even at least 80% at wavelengths in the range from about 340 to about 380 nm.

The annealed YAP scintillator crystals may be still further characterized as having a high photon yield (light yield) as compared with the prior art YAP scintillator crystals. The prior art crystals (having color centers) have a comparatively low photon yield due to self-absorption and intrinsic quenching. The annealed YAP scintillator crystals may have a photon yield up to twice that of the prior art crystals. Moreover, the photon yield of the annealed YAP scintillator crystals has a high spatial uniformity (a low spatial non-uniformity) as compared to the prior art YAP crystal scintillators. The non-uniform spatial distribution of the color centers in the prior art crystals results in a correspondingly non-uniform photon yield (i.e., the photon yield is much less at the lower end of the crystal than the upper end). In contrast to the prior art crystals, the disclosed YAP scintillator crystals have a photon yield with a high spatial uniformity (low spatial non-uniformity). For example, the photon yield spatial non-uniformity may be less than about 10 percent (e.g., less than about 5 percent, or even less than about 2 percent). The photon yield spatial non-uniformity may be obtained for example by comparing the photon yield at the top of the crystal with that photon yield at bottom of the crystal.

Figure 6:
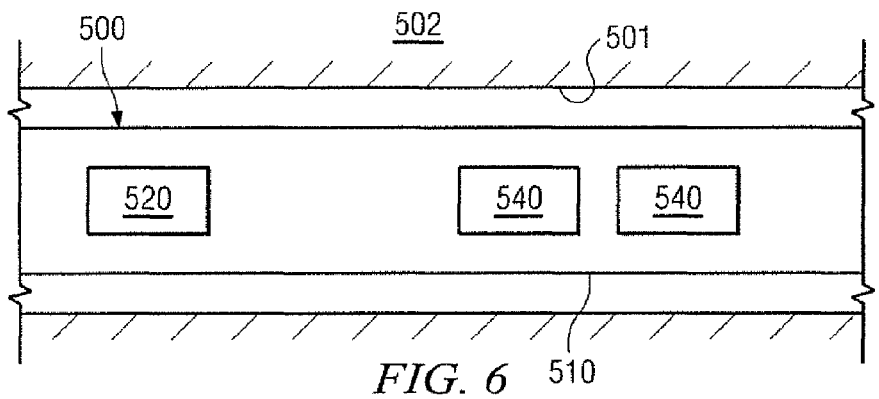
FIG. 6 depicts a downhole nuclear logging tool deployed in a subterranean wellbore.

FIG. 6 depicts a downhole nuclear logging tool 500 deployed in a subterranean wellbore 501. Logging tool 500 includes a neutron source 520 and at least one gamma ray detector 540 (e.g., near and far detectors) deployed in logging tool body 510. The neutron source 520 may include substantially any suitable source capable of emitting neutrons into a surrounding formation 502 to produce inelastic gamma-rays. For example, the neutron source 520 may be a pulsed electronic neutron source, such as a Minitron™ by Schlumberger Technology Corporation. Additionally or alternatively, the neutron source 18 may be a radioisotope source capable of emitting fast neutrons. The gamma ray detector(s) 540 include a YAP scintillator crystal. The YAP scintillator crystal may be fabricated, for example, using one of the methods described in FIGS. 2 and 3.

Nuclear logging tool 500 may be fabricated, for example, by deploying the neutron source 520 and the gamma ray detector(s) 540 in a logging tool body 510 such as a logging while drilling tool body or a wireline logging tool body. A YAP single crystal may be annealed as described above with respect to FIGS. 2 and 3 in an oxygen containing environment to obtain a partially annealed crystal and then in an inert environment or a reducing environment to obtain the YAP single crystal scintillator which may be in turn deployed in a gamma ray detector and in the logging tool body.

With continued reference to FIG. 6 logging tool 500 may further include an electronic controller (not shown). The controller may be configured, for example, to process gamma rays received by the gamma ray detector(s) 540 to estimate at least one property of the formation 502. For example, the received gamma rays may be processed to obtain a thermal neutron capture cross section (known in the art as "sigma") and/or carbon oxygen ratio of the formation. Such processing methodologies are disclosed in more detail, for example, in U.S. Pat. Nos. 4,721,853 and 4,937,446, which are incorporated by reference herein in their entirety.

The electronic controller may be further configured to cause the neutron generator to emit neutrons into a subterranean formation (during a logging operation) and cause the gamma ray detector(s) to detect gamma rays resulting from an interaction between the emitted neutrons and the subterranean formation.

The disclosed embodiments are now described in further detail by way of the following example, which is not intended to be limiting in any way.

EXAMPLE 1

A single crystal $YAlO_3:Ce^{3+}$ cylindrical boule having a length of 30 mm and a diameter of 40 mm was grown having a <100> orientation. The as grown crystal had an absorption coefficient of greater than 2 cm$^{-1}$ at a wavelength of 370 nm. The crystal was partially annealed in a first annealing step as follows. The crystal was placed in an air containing furnace at ambient temperature. The temperature was increased to 1200 degrees C. over a period of six hours and then held at 1200 degrees C. for one hour. The furnace temperature was then cooled to ambient temperature over a second period of six hours.

Figure 7:
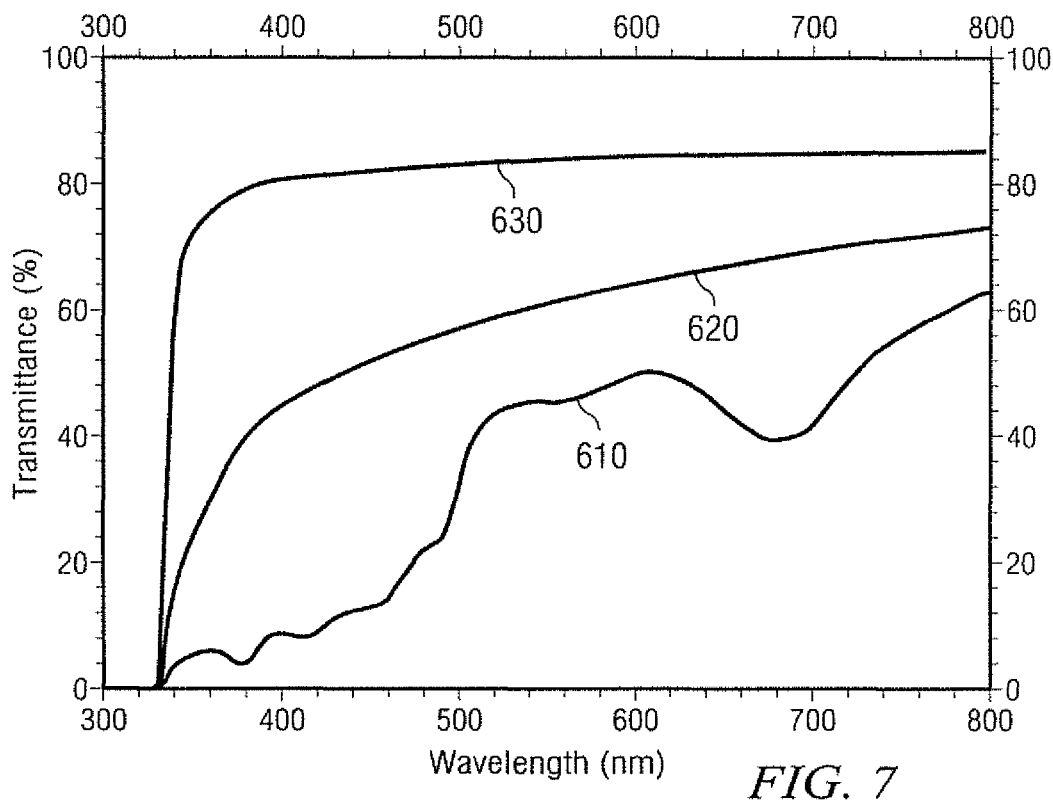
FIG. 7 depicts a plot of optical transmittance versus wavelength for one example of an as grown crystal, a partially annealed crystal, and a fully annealed crystal.

The crystal was then placed in a second furnace having tungsten heating elements in a molybdenum crucible and covered with a sheet of molybdenum thermal shielding. The furnace was then evacuated to a pressure of 10$^{-4}$ mbar and then filled with argon gas to an absolute pressure of 1.2 bar. The crystal was then annealed in this atmosphere for 80 hours at 1700 degrees C. Transmission spectra of the as-grown crystal, the partially annealed crystal, and the fully annealed crystal were obtained using a Brucker FTIR Spectrometer and AvaSpec-2048 Fiber Optic Spectrometer. These spectra are depicted on FIG. 7. The transmittance spectrum of the as grown crystal is depicted at 610. The transmittance spectra of the partially and fully annealed crystals are depicted at 620 and 630. It is readily apparent that the two-step annealing process described above greatly increases the transmittance of the YAP crystal over all wavelengths from about 350 to about 800 nm. For example, at 370 nm the transmittance of the as grown crystal was about 5%. After the first air annealing step the transmittance was increased to about 35%. After the second annealing step has been completed as described herein the transmittance was increased to nearly 80%.

EXAMPLE 2

Figure 8:
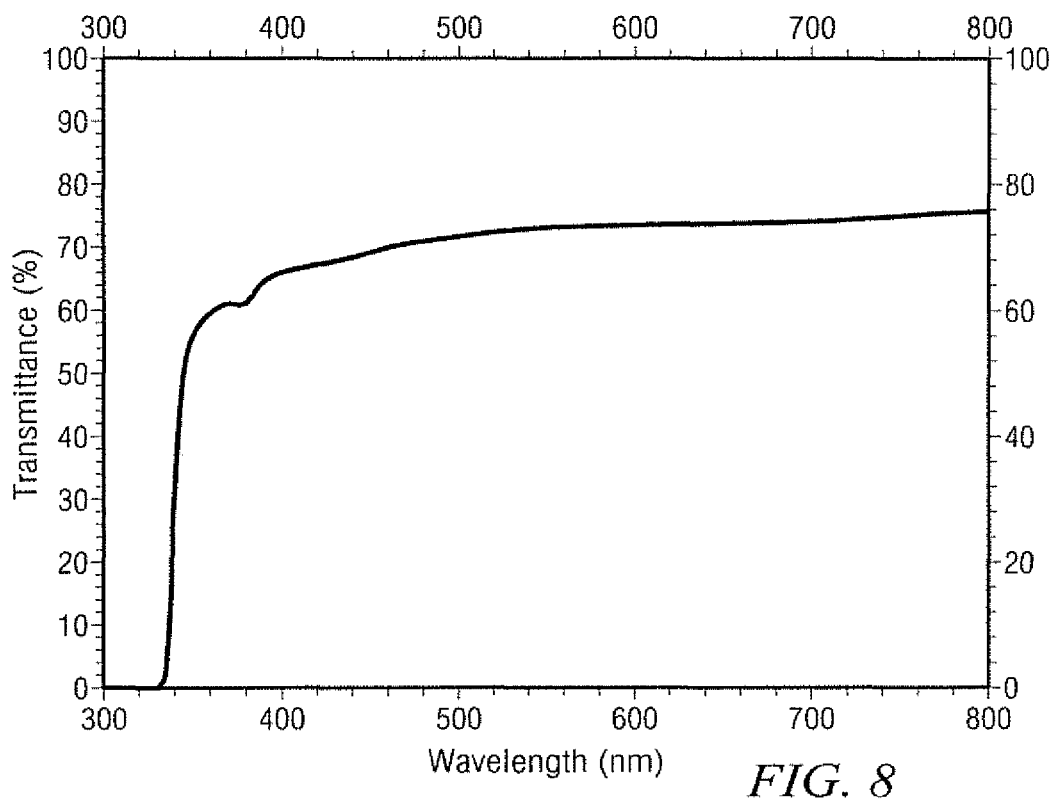
FIG. 8 depicts a plot of optical transmittance versus wavelength for another example of a fully annealed crystal.

A single crystal YAlO$_3$:Ce$^{3+}$ cuboidal boule having dimensions of 20×20×25 mm was prepared. The as prepared crystal had an absorption coefficient of greater than 2 cm$^{-1}$ at a wavelength of 370 nm. The crystal was partially annealed in an air containing furnace at 1100 degrees C. for two hours. The crystal was then placed in a second furnace having wolfram heating elements in a molybdenum crucible and covered with a sheet of molybdenum thermal shielding. The furnace was evacuated to a pressure of 10$^{-4}$ mbar and then filled with hydrogen gas to an absolute pressure of 1.2 bar. The crystal was then annealed in this atmosphere for 200 hours at 1600 degrees C. A transmission spectrum of the fully annealed crystal was obtained as described in Example 1 and is depicted on FIG. 8. As in Example 1 the two-step annealing process described above has greatly increases the transmittance of the YAP crystal over all wavelengths from about 350 to about 800 nm. For example, at 370 nm the transmittance of the as fully annealed crystal was greater than about 60 percent.

Although high transmittance single crystal Yttrium Aluminum Perovskite scintillators and methods for fabricating such scintillators have been described in detail, it should be understood that various changes, substitutions and alternations can be made herein without departing from the spirit and scope of the disclosure as defined by the appended claims.

What is claimed is:

1. A method for fabricating a yttrium aluminum perovskite single crystal scintillator, the method comprising:
   (a) acquiring a yttrium aluminum perovskite single crystal body having a thickness of at least 5 mm;
   (b) annealing the yttrium aluminum perovskite single crystal body in an oxygen containing environment to obtain a partially annealed crystal; and
   (c) annealing the partially annealed crystal in an inert environment or a reducing environment to obtain the yttrium aluminum perovskite single crystal scintillator having a transmittance of at least 50% at a wavelength of 370 nm.

2. The method of claim 1, wherein the yttrium aluminum perovskite single crystal body is grown using the Czochralski method.

3. The method of claim 1, wherein the thickness of the yttrium aluminum perovskite single crystal body is at least 10 mm.

4. The method of claim 1, wherein the oxygen containing environment is air.

5. The method of claim 1, wherein the single crystal body is annealed in (b) at a temperature in a range from 1100 degrees C. to 1500 degrees C.

6. The method of claim 1, wherein the inert environment comprises a vacuum having a pressure less than 5×10$^{-4}$ bar.

7. The method of claim 1, wherein the inert environment comprises argon or nitrogen gas.

8. The method of claim 1, wherein the reducing environment comprises hydrogen gas.

9. The method of claim 1, wherein the partially annealed crystal is annealed in (c) at a temperature above 1600 degrees C.

10. A method for fabricating a downhole nuclear logging tool, the method comprising:
    (a) annealing a yttrium aluminum perovskite single crystal body having a thickness of at least 5 mm in an oxygen containing environment to obtain a partially annealed crystal;
    (b) annealing the partially annealed crystal in an inert environment or a reducing environment to obtain a yttrium aluminum perovskite single crystal scintillator having a transmittance of at least 50% at a wavelength of 370 nm; and
    (c) deploying the yttrium aluminum perovskite single crystal scintillator in a downhole logging tool body to obtain a nuclear logging tool having a gamma ray detector.

11. The method of claim 10, wherein the yttrium aluminum perovskite single crystal body is grown using the Czochralski method.

12. The method of claim 10, wherein the thickness of the yttrium aluminum perovskite single crystal body is at least 10 mm.

13. The method of claim 10, wherein the oxygen containing environment is air.

14. The method of claim 10, wherein the single crystal body is annealed in (b) at a temperature in a range from 1100 degrees C. to 1500 degrees C.

15. The method of claim 10, wherein the inert environment comprises a vacuum having a pressure less than 5×10$^{-4}$ bar.

16. The method of claim 10, wherein the inert environment comprises argon or nitrogen gas.

17. The method of claim 10, wherein the reducing environment comprises hydrogen gas.

18. The method of claim 10, wherein the partially annealed crystal is annealed in (c) at a temperature above 1600 degrees C.

19. A method for fabricating a yttrium aluminum perovskite single crystal scintillator, the method comprising:

forming a yttrium aluminum perovskite single crystal boule to have a minimum thickness of at least 5 mm and a transmittance of at least 50% at a wavelength of 370 nm, the forming including at least one step of annealing.

20. The method of claim 19, wherein the at least one step of annealing comprises:
    annealing in an oxygen containing environment to obtain a partially annealed crystal; and
    annealing the partially annealed crystal in an inert environment or a reducing environment.

21. The method of claim 19, wherein the yttrium aluminum perovskite single crystal boule is grown using the Czochralski method.

22. The method of claim 19, wherein the single crystal boule has a minimum thickness of 10 mm.

23. The method of claim 19, wherein the oxygen containing environment is air.

24. The method of claim 19, wherein the inert environment comprises a vacuum having a pressure less than $5 \times 10^{-4}$ bar.

25. The method of claim 19, wherein the inert environment comprises argon or nitrogen gas.

26. The method of claim 19, wherein the reducing environment comprises hydrogen gas.

* * * * *